(12) United States Patent
Oi et al.

(10) Patent No.: US 6,830,985 B2
(45) Date of Patent: Dec. 14, 2004

(54) METHOD AND APPARATUS FOR PRODUCING BONDED DIELECTRIC SEPARATION WAFER

(75) Inventors: Hiroyuki Oi, Tokyo (JP); Hitoshi Okuda, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 0 days.

(21) Appl. No.: 10/258,396

(22) PCT Filed: Mar. 5, 2001

(86) PCT No.: PCT/JP01/01728
§ 371 (c)(1),
(2), (4) Date: Oct. 24, 2002

(87) PCT Pub. No.: WO01/84633
PCT Pub. Date: Nov. 8, 2001

(65) Prior Publication Data
US 2003/0092244 A1 May 15, 2003

(30) Foreign Application Priority Data
Apr. 28, 2000 (JP) ......................................... 2000-130790

(51) Int. Cl.[7] ............................................... H01L 21/76
(52) U.S. Cl. .................... 438/401; 438/459; 438/977
(58) Field of Search .............................. 438/401, 406, 438/455, 458, 459, 977

(56) References Cited

U.S. PATENT DOCUMENTS 5,324,687 A * 6/1994 Wojnarowski ............... 438/977
5,869,386 A * 2/1999 Hamajima et al. ........... 438/459
6,323,108 B1 * 11/2001 Kub et al. .................... 438/459
6,362,069 B1 * 3/2002 Forrest et al. ............... 438/401

FOREIGN PATENT DOCUMENTS

| EP | 0 926 706 A2 | 6/1999 |
|----|----|----|
| JP | 3-183130 A | 8/1991 |
| JP | 5-90117 A | 4/1993 |
| JP | 5-152181 A | 6/1993 |
| JP | 8-97110 A | 4/1996 |
| JP | 11-274442 A | 10/1999 |
| JP | 2000-21974 A | 1/2000 |

* cited by examiner

Primary Examiner—Chandra Chaudhari
(74) Attorney, Agent, or Firm—Kubovcik & Kubovcik

(57) ABSTRACT

The present invention provides a method for producing a bonded dielectric separation wafer in which an auto-alignment can be carried out with reference to the orientation flat of a supporting substrate wafer after the wafer bonding step, and also an apparatus to be used for bonding wafers. When wafers are placed one upon another, the silicon wafers 10, 20 are irradiated with transmission light in order to capture the transmission images thereof. The positions of the pattern of dielectric isolation grooves 13 in the silicon wafer 10 and the orientation flat 20a of the silicon wafer 20 are determined from the images and the bonding position of the wafers 10, 20 is determined based on the determined positions. Auto-alignment of the bonded dielectric separation wafer can thereby be carried out with reference to the orientation flat 20a of the silicon wafer 20 after the wafer bonding step.

7 Claims, 6 Drawing Sheets

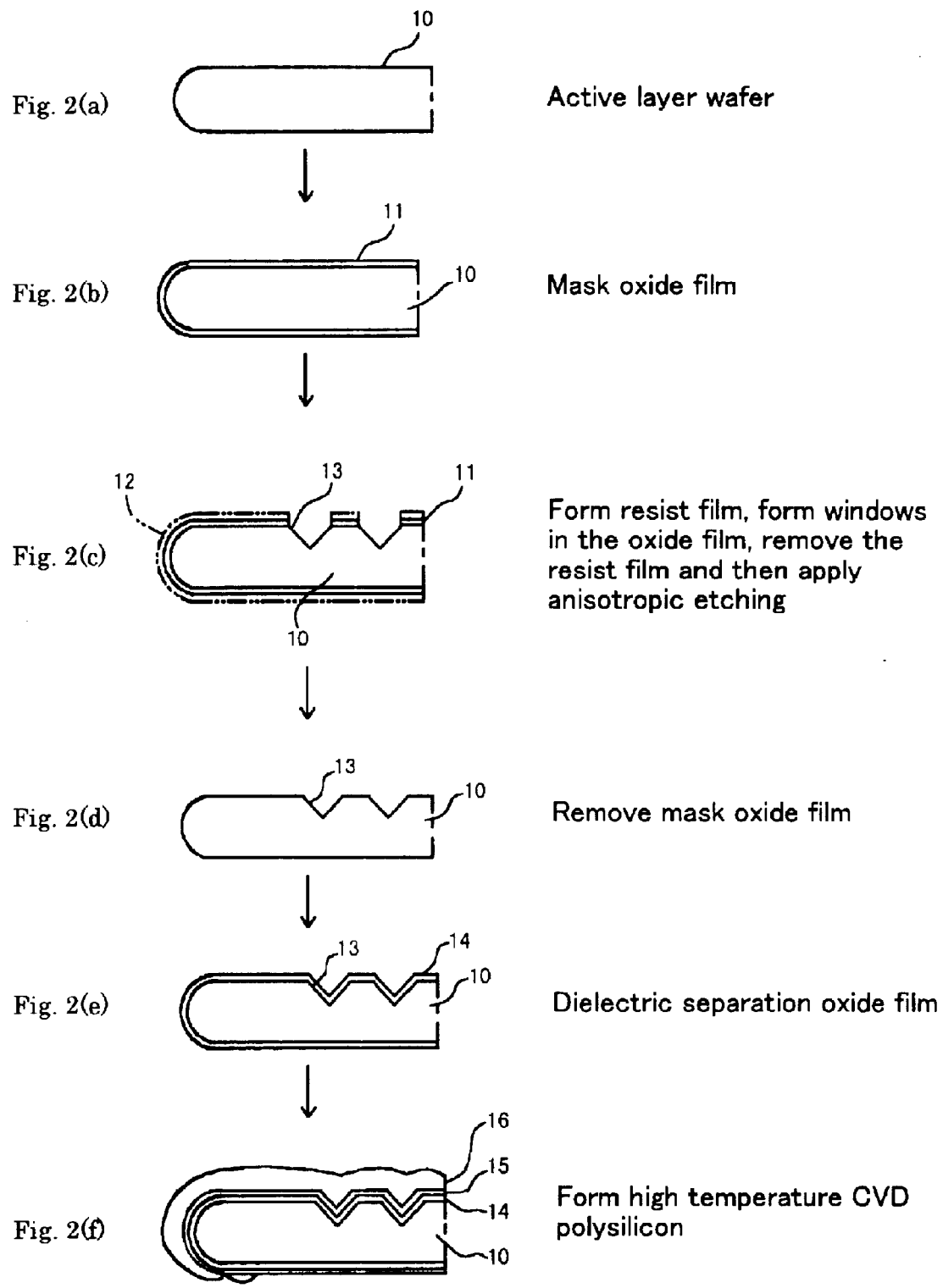

Grind and polish high temperature CVD polysilicon
Grow low temperature CVD polysilicon and then polish it Supporting substrate wafer Bonding after determining positions for placing wafers one upon another Beveling peripheral portion Grinding and polishing

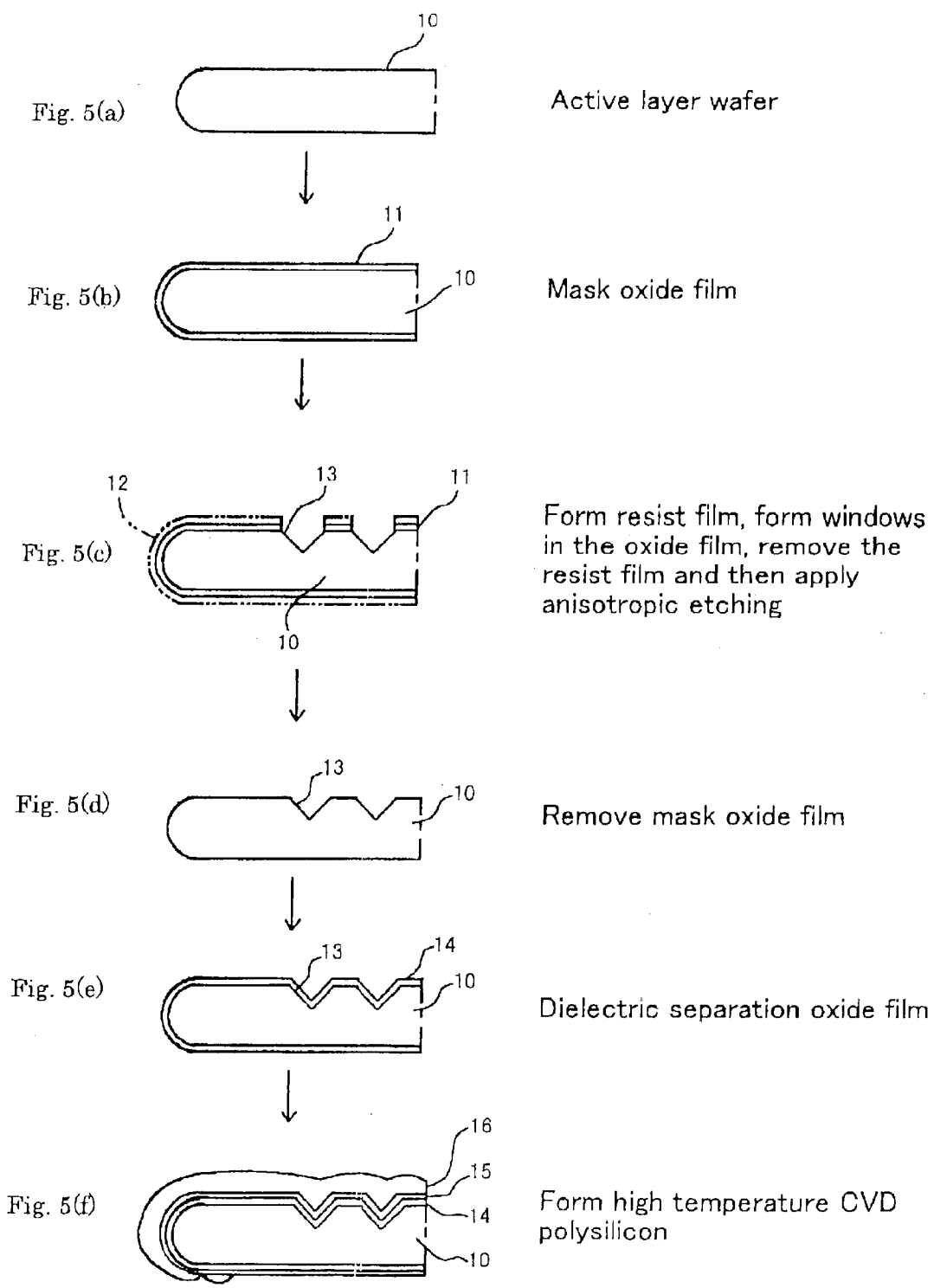

Grind and polish high temperature CVD polysilicon
Grow low temperature CVD polysilicon and then polish it Supporting substrate wafer Bonding after determining positions for placing wafers one upon another Beveling peripheral portion Grinding and polishing

METHOD AND APPARATUS FOR PRODUCING BONDED DIELECTRIC SEPARATION WAFER

FIELD OF THE INVENTION

The present invention relates to a method and an apparatus for producing a bonded dielectric separation wafer, and in more specific, to a method for producing such a bonded dielectric separation wafer having a certain physical relationship established between a position of an orientation flat, "OF", of a supporting substrate wafer and a position of a pattern of dielectric isolation grooves of an active layer wafer and also to an apparatus used for bonding those wafers.

DESCRIPTION OF THE PRIOR ART

In the prior art, a bonded dielectric separation wafer has been produced through respective steps shown in FIGS. 5 and 6.

In one prior art method, at first, a silicon wafer 10 having a mirror-polished surface is fabricated and prepared in accordance with a well-known method, which will be formed into an active layer wafer (see FIG. 5(a)). This silicon wafer 10 has an orientation flat "OF" formed therein. Secondary, a mask oxide film 11 is formed on a surface of this silicon wafer 10 (FIG. 5(b)). Further, after a photo resist 12 is deposited over the mask oxide film 11, the photo lithography method is applied to form openings in predetermined locations (in a predetermined pattern) thereof. Then, the mask oxide film 11 exposed through these openings is removed so as to form windows of predetermined pattern in the mask oxide film 11. Consequently, the top surface of the silicon wafer 10 can be partially exposed through these windows. Then, after the photo resist 12 is removed, this silicon wafer 10 is dipped in an alkaline etchant (IPA/KOH/H$_2$O) to anisotropically etch the inside of the window defined on the top surface of the wafer (FIG. 5(c)). Through these steps, V-shaped dielectric isolation grooves 13 are formed in the surface of the wafer.

In a subsequent step, this mask oxide film 11 is cleaned and removed using a dilute hydrofluoric acid solution or a buffer hydrofluoric acid solution (FIG. 5(d)). Then, a dielectric separation oxide film 14 is formed on the surface of the silicon wafer 10 through a thermal oxidation processing (FIG. 5(e)). As a result, the dielectric separation oxide film 14 having a predetermined thickness is formed over the surface of the silicon wafer 10 including the surfaces of the dielectric isolation grooves 13.

Subsequently, this silicon wafer 10 is coated with a seed polysilicon layer 15 over the surface thereof, i.e., over the dielectric separation oxide film 14, up to a predetermined thickness. After that, a high temperature CVD method is applied at the temperature of about 1200 to 1300° C. so as for a high temperature polysilicon layer 16 to grow over the dielectric separation oxide film 14 until it reaches the thickness of about 150 μm (FIG. 5(f)). After that, a peripheral portion of this silicon wafer 10 is beveled. In a subsequent step, polishing is applied to a back surface of this silicon wafer 10 so as to remove undesired portion of high temperature polysilicon, which has expanded to cover partially the back surface, thus to obtain a flat surface. Then, grinding and polishing are carried out until the high temperature polysilicon layer 16 on the top surface of the silicon wafer 10 becomes about 10 to 80 μm thick (FIG. 6(g)).

After that, a low-temperature CVD method is applied at a temperature in the range of 550 to 700° C. so as for a low-temperature polysilicon layer 17 to grow over the surface of the silicon wafer 10 up to 1 to 5 μm thick. In order to flatten a bonding surface, the top surface of this low-temperature polysilicon layer 17 is mirror-polished (FIG. 6(g)).

On the other hand, a silicon wafer 20 covered with a silicon oxide film 21 is prepared separately from said silicon wafer 10, which will function as a supporting substrate wafer (FIG. 6(h)). A surface of this silicon wafer 20 has also been mirror-polished. In addition, this silicon wafer 20 has been processed to have the orientation flat.

Then, this silicon wafer 20 is bonded with the other silicon wafer 10 prepared for the active layer wafer as described above, with the mirror-polished surfaces thereof contacting to each other (FIG. 6(i)). Thus, a base material of the bonded wafer has been fabricated.

After that, a thermal processing is applied to thus bonded wafer to enhance its bonding strength.

Then, as shown in FIG. 6(j), the peripheral region of this bonded wafer in the active layer wafer side is beveled. Specifically, the grinding is applied to the bonded wafer from the top surface of the silicon wafer 10 at an oblique angle such that a portion as defined to pass through the bonding interface and to reach the surface layer of the silicon wafer 20 may be cut off.

Then, the top surface of the bonded wafer in the active layer wafer side is ground and further polished (FIG. 6(k)). The volume to be ground and polished off from the active layer wafer should be determined such that the dielectric separation oxide film 14 may be partially exposed to the outside and thus dielectric separation silicon islands 10A separated from each other by the dielectric separation oxide film 14 may appear on top of the high temperature polysilicon layer 16. It is to be noted that the silicon oxide film 21 will be removed by the HF cleaning after the above step.

In this method according to the prior art as discussed above, after the high temperature polysilicon layer 16 having grown on the silicon wafer 10, the beveling process is applied thereto to remove the polysilicon deposited on the peripheral region of the wafer. However, in practice, it is impossible to carry out this removing process completely, and typically, a part of the polysilicon should be left in the peripheral region of the wafer in order to avoid the reduced diameter of the silicon wafer 10 owing to an excessive grinding.

This means that the polysilicon layers may also be left in the orientation flat (OF) portion of the silicon wafer 10.

This has often led to such a situation in which after the beveling, the "OF" formed by the residual high temperature polysilicon layer 16 is not in the parallel relationship with the "OF" of the silicon wafer 10.

Generally, the bonding of the wafers is carried out in such a manner that the "OF" of the active layer wafer and the "OF" of the supporting substrate wafer should be matched and then, in one example, the both wafers are bonded to each other from the central portions toward the peripheral portions thereof so as to increase the bonded area. In this manner, the two wafers can be bonded to each other, while keeping a certain physical relationship between the "OF" of the supporting substrate wafer and the grid pattern of the dielectric isolation grooves formed on the active layer wafer. In specific, the horizontal dielectric isolation grooves or structural elements of the grid pattern in parallel with Y-direction in FIG. 4 are set to be in parallel with the "OF" of the wafer for the supporting substrate. As a result from this setting, auto-alignment with reference to the "OF" of the supporting substrate wafer will be effective in each consecutive processing step following this bonding step.

However, whether or not this auto-alignment will effectively work depends on the condition of the "OF" portion of the active layer wafer, that the "OF" of the high temperature polysilicon layer should be in parallel with the original "OF" inherent to the active layer wafer. This is because the pattern of the dielectric isolation grooves is externally shielded with the high temperature polysilicon layer and accordingly it would not be possible to bond the supporting substrate wafer to the active layer wafer while visually observing the "OF" of the supporting substrate wafer and the horizontal grooves of said pattern on the active layer wafer and keeping the parallel relationship therebetween on the screen of a monitor, for example. That is, if the "OF" of the high temperature polysilicon layer is not parallel with the "OF" of the active layer wafer, the auto-alignment could not be carried out in any consecutive steps, such as an exposing process, for example.

SUMMARY OF THE INVENTION

The present invention has been made in the light of the problems described above, and an object thereof is to provide a method for producing a bonded dielectric separation wafer which allows an auto-alignment to be carried out with reference to an orientation flat "OF" of a supporting substrate wafer after a wafer bonding step, and an apparatus used for bonding those wafers.

The invention as defined in claim 1 provides a method for producing a bonded dielectric separation wafer comprising the steps of: growing a polysilicon layer on a top surface of an active layer wafer which has dielectric isolation grooves in a predetermined pattern having formed therein with reference to an orientation flat thereof and has been covered with a dielectric separation oxide film; polishing a top surface of the polysilicon layer; fabricating a bonded wafer by bonding the polished surface of the active layer wafer to a surface of a supporting substrate wafer having an orientation flat; beveling a peripheral portion of the bonded wafer; and after the beveling step, applying grinding and polishing to a back surface of the active layer wafer thereby making appear in the polished surface a plurality of dielectric separation silicon islands isolated by the dielectric separation oxide film; wherein in said bonding step, a transmission light, which may pass through the wafers, is used to detect a position of the pattern of the dielectric isolation grooves in the active layer wafer and a position of the orientation flat of the supporting substrate wafer, and based on the detected positions, the pattern of the dielectric isolation grooves of the active layer wafer and the orientation flat of the supporting substrate wafer are adjusted to fall in a certain physical relationship, and thereafter the bonding of the two wafers is carried out with the physical relationship held as adjusted.

A high temperature CVD method represents such a method in which a source gas containing silicon is introduced into a reactor together with a carrier gas (such as a $H_2$ gas) to cause silicon, which has been generated by heat decomposition or reduction of the source gas, to be deposited on a heated silicon wafer. Typically a chemical compound containing silicon, such as $SiCl_2H_2$, $SiHCl_3$ and $SiCl_4$, is used therefor.

As for the reactor, for example, a pancake reactor or a cylinder reactor may also be employed.

The temperature used in growing of the high temperature polysilicon may be varied depending on the heating system employed in the reactor. In a vertical reactor, for example, which is most typically used in this application, preferably the temperature is within a range of 1200 to 1290° C., more preferably within a range of 1230 to 1280° C. At the temperature below 1200° C., disadvantageously the silicon wafer is apt to be broken. On the other hand, the temperature higher than 1290° C. disadvantageously may cause a slip, leading an irregular bowing or a breaking of the silicon wafer.

The polysilicon layer may be grown to be such thick that will be equal to a thickness defined by multiplying the depth of anisotropic etching required for forming the dielectric isolation grooves by 2 to 3 and further adding a thickness of the polysilicon layer desired to be left. The polysilicon layer not as 2 times thick as the depth of the applied anisotropic etching sometimes could not be sufficient to fill up the etching grooves. On the other hand, the polysilicon layer more than 3 times thicker leads to undesired growth, meaning it to be uneconomical.

The etchant to be used in this anisotropic etching may include KOH(IPA/KOH/$H_2O$), KOH(KOH/$H_2O$), and KOH (hydrazine/KOH/$H_2O$). As for the anisotropic etching condition, a conventional condition may be applied thereto.

Generally applicable conditions may be employed in each process required for forming a window portion in a resist film lying on the top surface of the wafer for the anisotropic etching.

The transmission light as discussed above is not limited to but may be any light that can pass through respective wafers. For example, an infrared ray or an X-ray may be used. In the case where the silicon wafer is used, the infrared ray having a wave length of 1.1 microns ($\mu$m) or longer may be used. For the wafer of GaAs, the infrared ray having the wave length of 0.9 $\mu$m or longer may be used.

A transmission image of the active layer wafer and a transmission image of the supporting substrate wafer captured by the transmission light may be visually observed, for example, on a monitor screen. Consequently, an operation of placing those transmission images with one on the other can be executed on that monitor screen.

In the present invention as defined in claim 1, based on those transmission images, the pattern in the active layer wafer and the orientation flat of the supporting substrate wafer may be adjusted to fall in a certain physical relationship.

In this context, adjusting the pattern in the active layer wafer and the orientation flat of the supporting substrate wafer into a certain physical relationship means that, for example, an extending direction of the lateral grooves which are structural elements of the grid pattern is set to be parallel with the orientation flat of the supporting substrate wafer. Alternately, the grooves in the other direction (the longitudinal grooves) may be positioned to be orthogonal to the "OF" of the supporting substrate wafer.

The present invention as defined in claim 2 provides a method for producing a bonded dielectric separation wafer in accordance with claim 1, in which an extending direction of the dielectric isolation grooves on said active layer wafer is set to be parallel with the orientation flat of the supporting substrate wafer.

The present invention as defined in claim 3 provides a method for producing a bonded dielectric separation wafer in accordance with claim 1 or 2, in which the active layer wafer and the supporting substrate wafer are both silicon wafers and further an infrared ray is used as the transmission light.

The present invention as defined in claim 4 provides a method for producing a bonded dielectric separation wafer comprising the steps of: growing a polysilicon layer on a top surface of an active layer wafer which has dielectric isolation grooves in a predetermined pattern having formed therein with reference to an orientation flat thereof and has been covered with a dielectric separation oxide film; polishing a top surface of the polysilicon layer; fabricating a bonded wafer by bonding the polished surface of the active layer wafer to a surface of a supporting substrate wafer having an orientation flat; beveling a peripheral portion of the bonded wafer; and after the beveling step, applying grinding and polishing to a back surface of the active layer wafer thereby making appear in the polished surface a plurality of dielectric separation silicon islands isolated by the dielectric separation oxide film; wherein in said bonding step, a transmission light, which may pass through the wafers, is used to detect a position of the orientation flat of the active layer wafer and a position of the orientation flat of the supporting substrate wafer, and based on the detected positions, the two orientation flats are matched with each other, and thereafter the bonding of the active layer wafer and the supporting substrate wafer is carried out with the physical relationship therebetween held as matched.

The present invention as defined in claim 5 provides a method for producing a bonded dielectric separation wafer in accordance with claim 4, in which the active layer wafer and the supporting substrate wafer are both silicon wafers and further an infrared ray is used as the transmission light.

The present invention as defined in claim 6 provides an apparatus for bonding wafers, comprising: a first holding means for holding an active layer wafer; a second holding means for holding a supporting substrate wafer; a positioning means for determining proper positions for placing one upon another of the active layer wafer and the supporting substrate wafer held by the first and the second holding means, respectively; and a bonding means for bonding the active layer wafer to the supporting substrate wafer, after the positions for placing the wafers one upon another having been determined, wherein said positioning means has a transmission detecting section for detecting respective portions in respective wafers working as markers in placing the wafers one upon another based on a transmission image of the supporting substrate wafer and another transmission image of the active layer wafer, each image captured as a result of irradiation of a transmission light capable of passing through those wafers, and executes the positioning of the active layer wafer and the supporting substrate wafer for placing one upon another based on the detected result from the transmission detecting section.

As for the first and the second holding means, for example, a wafer retainer plate utilizing a vacuum chuck may be employed.

As for the bonding means, for example, such an apparatus that can move the active layer wafer and the supporting substrate wafer in directions so as for the bonding surfaces thereof to come closer to each other may be employed. At that time, only the active layer wafer may be moved. Or otherwise, only the supporting substrate wafer may be moved. Alternatively, both of the wafers may be moved.

The marker for the supporting substrate wafer and the marker for the active layer wafer, which are used for placing one wafer on the other wafer is not limited. For example, the maker for the former may be the pattern of the dielectric isolation grooves in the active layer wafer or the orientation flat of the active layer wafer. Further, the marker for the latter may be the orientation flat of the supporting substrate wafer.

If the transmission light is the infrared ray, the infrared ray irradiated from an infrared illumination source (the transmission light capable of passing through the wafer) can be observed by an infrared TV camera. As the infrared TV camera may be used an infrared ray vidicon camera tube sensitive to the wave length in a range up to 1.9 $\mu$m. It is a matter of course that an image formed on the infrared TV camera may be made clearer to see with the aid of a contrast enhancing function, for example.

According to the present invention, after the polysilicon having grown, the peripheral region of the active layer wafer is beveled and then the bonding position of the active layer wafer with the supporting substrate wafer should be determined.

At that time, the transmission light is used to capture the transmission images of the active layer wafer and the supporting substrate wafer. From those two transmission images, the position of the marker (the pattern or the orientation flat) in the active layer wafer and the position of the marker (the orientation flat) in the supporting substrate wafer for placing wafers one upon another are detected, respectively, and then based on the respective detection results, the positions of the active layer wafer and the supporting substrate wafer are determined for placing one upon another. After the positioning having been determined, the both wafers are bonded to each other thus to fabricate the bonded wafer.

With this positioning completed, the auto-alignment of the bonded dielectric separation wafer with reference to the orientation flat of the supporting substrate wafer could be carried out in the processing steps (e.g., the exposing process) subsequent to the wafer bonding step.

The orientation flat for those wafers may be a main "OF" or a sub "OF". The sub "flat" may be formed in a location at an angle of 90 or 45 degrees with respect to the main "flat" along the circumferential direction.

According to the present invention, since the positions of the active layer wafer and the supporting substrate wafer for placing one upon another are determined from the positions of the markers in the both wafers for placing one on another captured by irradiating the transmission light against them, therefore the auto-alignment of the bonded dielectric separation wafer can be carried out with reference to the orientation flat of the supporting substrate wafer in the steps subsequent to the wafer bonding step.

BRIEF DESCRIPTION OF THE DRAWINGS

FIG. 2 is a sectional view for illustrating respective steps included in the method for producing the bonded dielectric separation wafer according to the embodiment of the present invention;

FIG. 5 is a sectional view for illustrating steps for producing a bonded dielectric separation wafer according to the prior art.

PREFERRED EMBODIMENTS FOR IMPLEMANTING THE PRESENT INVENTION

Figure 1:
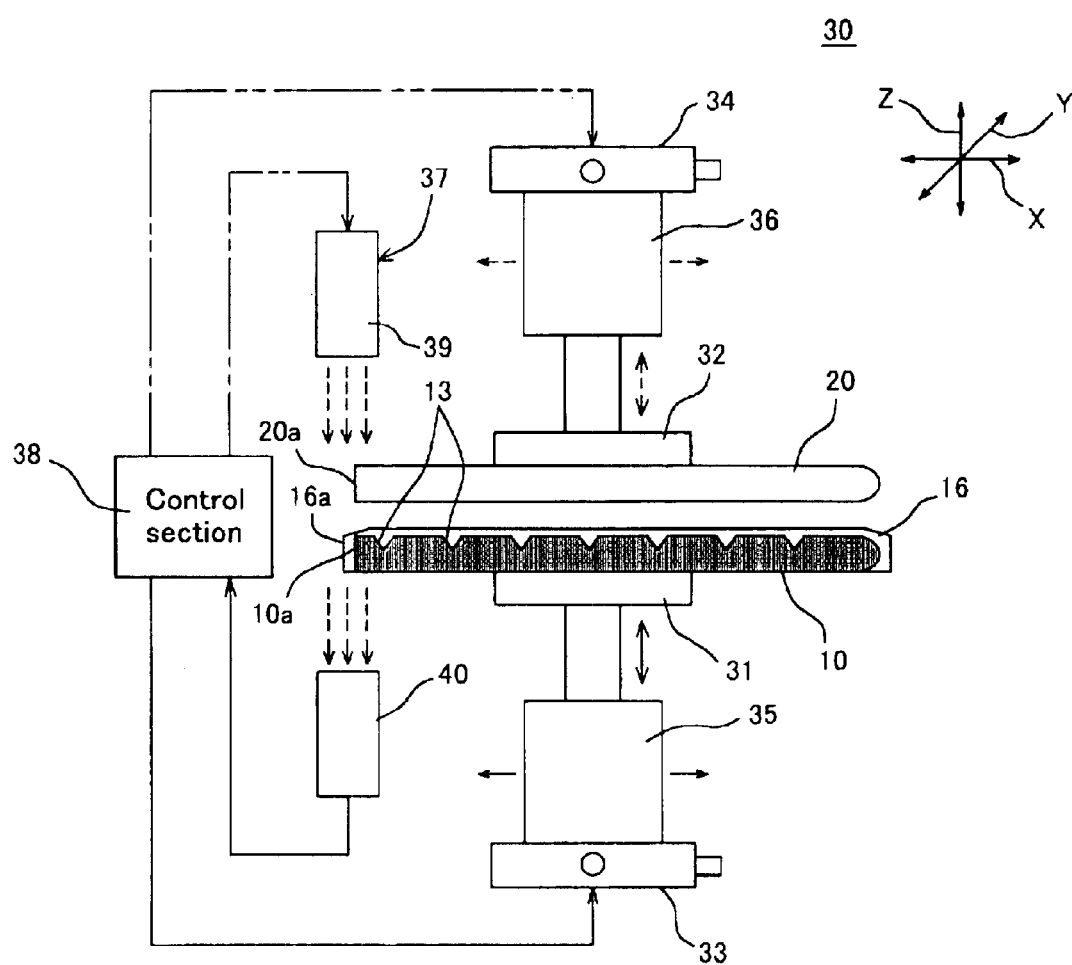
FIG. 1 is a schematic diagram for illustrating a wafer bonding apparatus used in a method for producing a bonded dielectric separation wafer according to one embodiment of the present invention.

A method for producing a bonded dielectric separation wafer according to a preferred embodiment of the present invention will now be described. It is to be noted that the explanation in this specification is directed to the method, as an example, for producing a bonded dielectric separation wafer which has been described in connection with the prior art. Accordingly, the same reference numerals are used to designate the same components. For the convenience of the explanation, one direction within a horizontal plane is designated as an X-direction, another direction orthogonal to the X-direction within the horizontal plane as a Y-direction and another direction along a vertical plane as a Z-direction.

At first, a silicon wafer 10 with a diameter in a range of 4 to 6 inches having a mirror polished surface is fabricated and prepared, which will be formed into an active layer wafer (FIG. 2(a)). A surface orientation should be (100). An orientation flat "OF" (a main flat) has been formed in a peripheral region thereof.

In next step, this silicon wafer 10 is cleaned.

After that, a mask oxide film (a $SiO_2$ film) 11 having a thickness of, for example, 1 $\mu$m is formed on a top surface of this silicon wafer (FIG. 2(b)). It may be formed, foe example, by thermal oxidation. Alternatively, a nitride film ($SiN_x$), instead of the mask oxide film 11, may be grown by the CVD method.

Then, a known photolithography method is used to form a photo resist film 12 on this mask oxide film 11. After that, in accordance with a well-known method, windows in a predetermined pattern (e.g., a grid pattern) are formed in this photo resist film 12 (FIG. 2(c)).

Subsequently, the mask oxide film 11 is etched through those windows thus to form the same pattern of windows, thereby partially exposing the top surface of the silicon wafer 10. After that, the photo resist film 12 is removed (again FIG. 2 (c)). Then, the surface of the wafer is cleaned.

Subsequently, the silicon wafer 10 is dipped in an anisotropic etchant (IPA/KOH/$H_2O$) for a predetermined period so as to etch the surface of the wafer with this mask oxide film 11 used as a masking. This etching forms concavities (recesses) in a predetermined pattern on the top surface of the silicon wafer.

In specific, the anisotropic etching is applied to the top surface of the silicon wafer 10, and as a result, dielectric isolation grooves 13, each having a V-shaped section with a depth of 70 to 80 $\mu$m are formed thereon (again FIG. 2(c)).

In next step, this mask oxide film 11 is cleaned and removed using, for example, a dilute HF solution (FIG. 2(d)).

After that, the silicon wafer is doped with dopant if necessary, and then a dielectric separation oxide film 14 is formed over the top surface (also over the back surface) of the wafer up to a predetermined thickness by way of the thermal oxidation processing (FIG. 2(e)). At that time, the dielectric separation oxide film 14 is also formed over an inner wall surface of the dielectric isolation grooves 13.

In the next step, the surface of the silicon wafer 10 is cleaned.

Subsequently, the silicon wafer 10 is coated with a seed polysilicon layer 15 over the top surface thereof, i.e., over the dielectric separation oxide film 14 in the top surface side, up to a predetermined thickness (FIG. 2(f)). After the coating, the surface thereof is cleaned.

In the next step, a high temperature CVD method is applied at the temperature of about 1200 to 1300° C. so as for a high temperature polysilicon layer 16 to grow over the seed polysilicon layer 15 up to about 150 $\mu$m thick (again FIG. 2(f)). A vertical reactor and a known method may be used.

In further step, the polysilicon deposited on the peripheral region of the silicon wafer 10 is beveled within a range not to touch the inner silicon wafer. For beveling, a known beveling wheel may be used.

Subsequently, the back surface of the silicon wafer 10 is polished so as to remove an undesired portion of the high temperature polysilicon which has extended excessively to cover a part of the wafer back surface, thereby flattening the back surface (FIG. 3(g)). The polishing may be carried out using a known polishing material and polishing cloth.

Figure 3G:
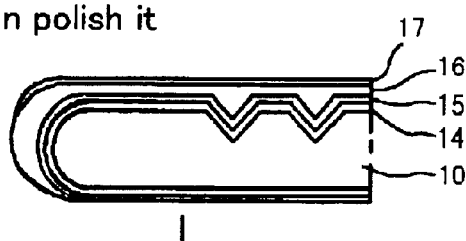
FIG. 3 is also a sectional view for illustrating respective steps included in the method for producing the bonded dielectric separation wafer according to the embodiment of the present invention.

Then, the high temperature polysilicon layer 16 on the top surface of the wafer is ground and polished until it reaches the thickness in a range of 10 to 80 $\mu$m (FIG. 3(g)). After the grinding with a grinding wheel having been applied, the ground surface is polished in the known manner.

After that, a low-temperature CVD method is applied at a temperature in the range of 550 to 700° C. so as for a low-temperature polysilicon layer 17 to grow over the top surface of the silicon wafer up to 1 to 5 $\mu$m thick. This may be carried out under the known conditions and in the known equipment.

Then, in order to flatten the bonding surface, the top surface of this low temperature polysilicon layer 17 is mirror polished (again FIG. 3(g)). This may be carried out by using a known polishing agent and a known polishing cloth.

Figure 3H:
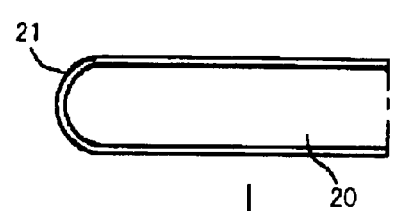

On the other hand, another silicon wafer 20 in the same size as the silicon wafer 10, covered with a silicon oxide film 21 and having a mirror-polished surface is prepared, which will work as a supporting substrate wafer (FIG. 3(h)). The orientation flat "OF" has been also formed therein similarly to the silicon wafer 10.

Subsequently, a relational positioning is carried out between the silicon wafer 20 and the silicon wafer 10 for the active layer wafer in order to place them one upon another with their mirror polished surfaces facing to each other.

Figure 3I:
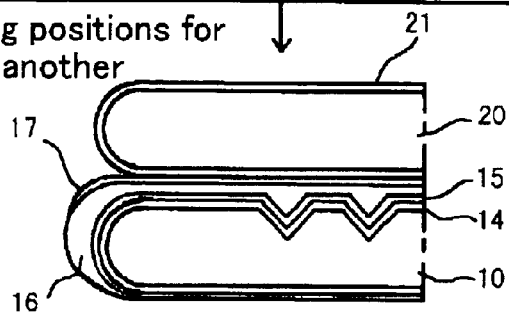

Then, the two wafers 10 and 20 are brought into contact with each other thus to be bonded (FIG. 3(i)). For example, this may be carried out in such a manner that the bonding area may be increased from the central portion toward the peripheral region.

Herein, the positioning step for placing the silicon wafer 10 and the silicon wafer 20 one upon another and the bonding step by the use of wafer bonding apparatus 30 will be described in more detail with reference to FIG. 1.

As shown in FIG. 1, the wafer bonding apparatus 30 comprises a wafer retainer plate (a first holding means) 31 for holding the silicon wafer 10 and another wafer retainer plate (a second holding means) 32 for holding the silicon wafer 20. The wafer bonding apparatus 30 further comprises a pair of XY-tables (a positioning means) 33 and 34 which move the respective wafers 10 and 20 along the orthogonal directions (X-direction and Y-direction) within a horizontal plane, respectively and determine the positions of the wafers 10, 20 for placing one upon another, and a pair of elevation cylinders (a bonding means) 35 and 36 which are mounted on the corresponding XY-tables 33 and 34 respectively and move the wafers 10 and 20 to come closer to each other for determining the positions for placing them one upon another or otherwise to press and thus bond the wafers 10 and 20 to each other in the bonding step. Also, this wafer bonding apparatus 30 further comprises a transmission detecting section 37 for irradiating an infrared ray (transmission light) which passes through both wafers 10 and 20, and detecting from the captured transmission images the positions of the pattern of the dielectric isolation grooves on the silicon wafer 10 and the "OF" 20a of the silicon wafer 20, which are functioning as markers for placing the wafers one upon another, and a control section 38 for controlling respective components of the apparatus.

Both of the wafer retainer plates 31, 32 are of the vacuum chuck type. In one exemplary configuration, a plurality of suction ports in communication with a negative pressure source are opened in predetermined locations on the wafer retainer plates 31 and 32.

The XY-tables 33 and 34 are operatively disposed in opposite to each other as spaced by a predetermined distance along the Z-direction yet maintaining the parallel relationship therebetween so as to be capable of moving within the horizontal plane. Specifically, in this configuration, each of the XY-tables 33 and 34 may be driven by a driving motor in the X-direction and by another driving motor in the Y-direction so as to move in the specified directions. It is to be noted that those XY-tables 33 and 34 may be configured to be free to rotate respectively, within the horizontal planes. In this case, the XY-table, together with the driving motor, may be fixedly installed on a machine base which in turn, is rotated by an actuator.

An elevation cylinder 35 and another elevation cylinder 36 are vertically installed on an upper surface of the lower XY-table 33 and on an under surface of the upper XY-table 34, respectively.

The elevation cylinder 35 disposed in the lower side has its piston rod protruding upward and holds said wafer retainer plate 31 fixedly attached to a top end of the piston rod in the horizontal direction.

The elevation cylinder 36 disposed in the upper side has its piston rod protruding downward and holds said wafer retainer plate 32 fixedly attached to the top end of the piston rod in the horizontal direction.

As a result of the configuration described above, the wafer retainer plate 31 and the wafer retainer plate 32 are disposed in opposite to each other with a predetermined interval therebetween. Further, those wafer retainer plates 31 and 32 are adapted to come closer to and to move away from each other.

The silicon wafers 10 and 20 are respectively sucked onto the wafer retainer plates 31 and 32, with their mirror polished surfaces facing to each other.

The transmission detecting section 37 comprises an emission section 39 disposed above the peripheral edges of those silicon wafers 10, 20 and a light acceptance section 40 disposed below the peripheral edges of those silicon wafers 10, 20, wherein the infrared ray irradiated from the emission section 39 is received by the light acceptance section 40. The emission section 39 comprises an infrared illumination source for irradiating the infrared ray at a predetermined wave length. The acceptance section 40 comprises an infrared ray TV (television) camera having an infrared ray vidicon camera tube, and an image created by the received light can be displayed on a TV monitor.

A control section 38 controls the infrared ray to be output from the emission section 39 and the incoming light input from the acceptance section 40, respectively. For example, the control section 38 controls the infrared ray of specified waver length to be output for a specified time period and at the same time controls the contrast in an incoming light signal to be enhanced so as to output it to the monitor as a transmission image. Further, the control section 38 controls the respective outputs of the XY-tables 33, 34 and the elevation cylinders 35, 36. The control section 38 may be composed of a computer system comprising, for example, a CPU, a ROM, a RAM, an I/O and so on.

An operation of this wafer bonding apparatus 30 will now be explained.

At first, the apparatus handles the silicon wafers 10 and 20 transferred by robot hands or the like in such a manner that the silicon wafer 10 may be sucked by the wafer retainer plate 31 having its suction face directed upward and the silicon wafer 20 may be sucked by the wafer retainer plate 32 having its suction face directed downward.

After that, the silicon wafers 10 and 20 are moved by the XY-tables 33 and 34 in the X- and Y-directions respectively, within the horizontal planes to approximate locations for placing them one upon another. In this step, the "OF" 10a of the silicon wafer 10 is approximately matched to the "OF" 20a of the silicon wafer 20 in plan view. At that time, the emission section 39 and the light acceptance section 40 are disposed above and below both "OFs" 10a, 20a.

Then, the piston rods of the elevation cylinders 35 and 36 are respectively protruded in the Z-direction to cause the silicon wafers 10 and 20 to come closer to each other until the gap between them reduces down to about 1 mm. At that time, a few pieces of wedges may be inserted into a space between the peripheral regions of the two silicon wafers 10, 20 so that a certain distance may be always kept between the two silicon wafers 10 and 20.

Subsequently, the infrared ray is irradiated from the emission section 39 toward the "OFs" 10a, 20a, which have been set in the positions for placing the wafers one upon another. The irradiated infrared ray passes through the silicon wafers 10, 20 in their peripheral edge portions and a set of detection data for them is sent to the control section 38, which is in turn displayed as the transmission images representative of the silicon wafers 10, 20 on the monitor screen. After that, based on these transmission images, the control section 38 instructs the XY-table 33 to move in the XY-direction so that the pattern of the dielectric isolation grooves 13 may be fall in a specific physical relationship with respect to the "OF" 20a (i.e., so that the parallel relationship between the lateral grooves and the "OF" may be established). This may allow the "OF" 20a to be positioned in parallel with the respective dielectric isolation grooves (lateral grooves) 13 in the Y-direction even if the polysilicon layer 16 inhibits the dielectric isolation grooves 13 from being visually observed.

Figure 4:
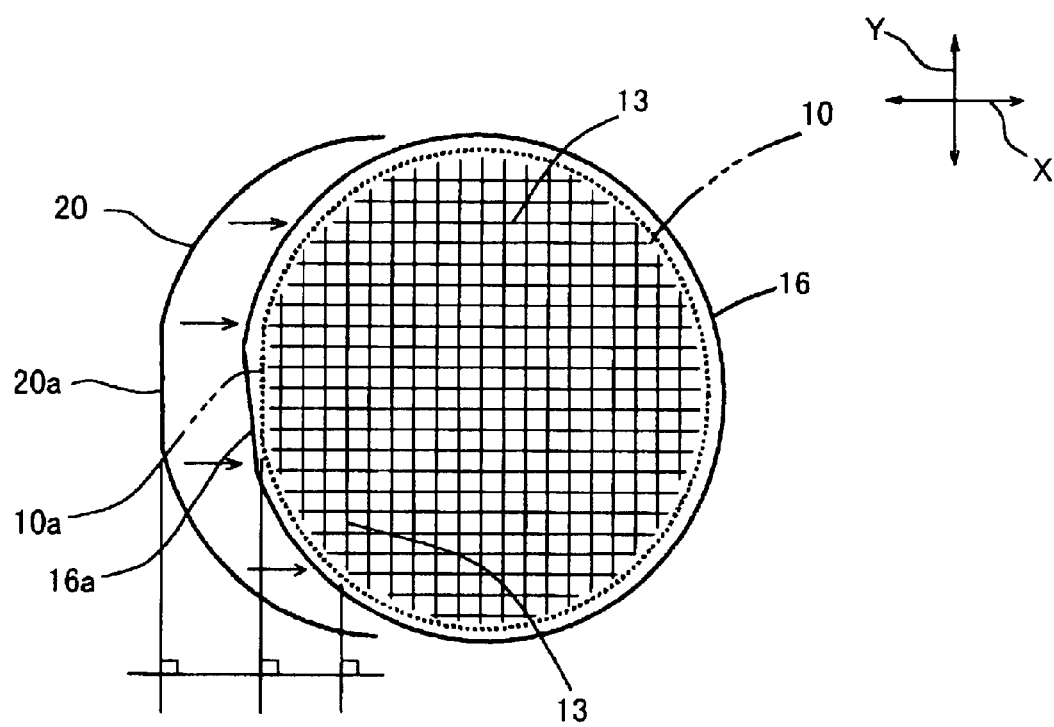
FIG. 4 is a plan view for illustrating a step for placing wafers one upon another in the method for producing the bonded dielectric separation wafer according to the embodiment of the present invention.
Figures 6G, 6H:
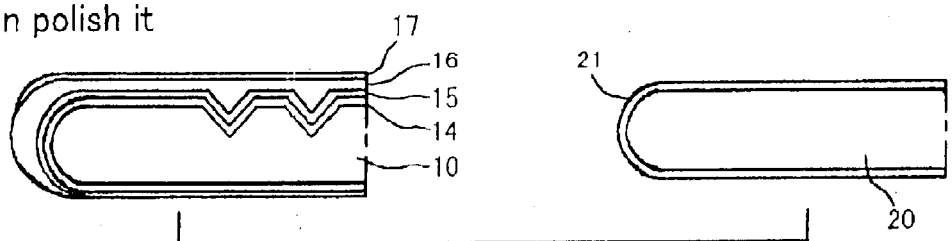
FIG. 6 is a sectional view for illustrating steps for producing the bonded dielectric separation wafer according to the prior art.
Figure 6I:
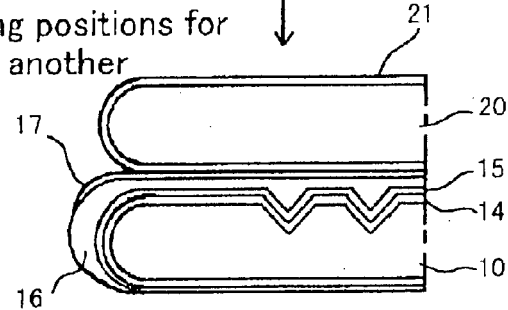
Figure 6J:
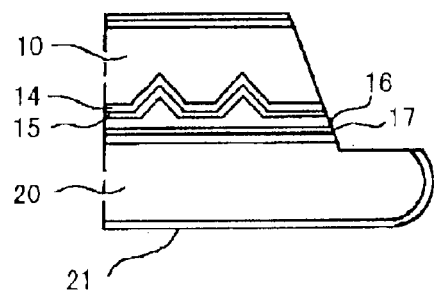
Figure 6K:
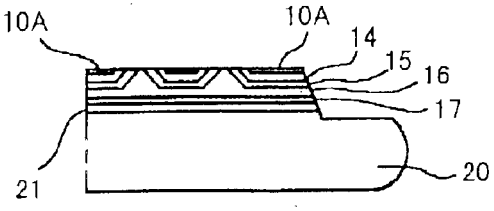

It is to be noted that during anisotropic etching of the dielectric isolation grooves 13, each of the dielectric isolation grooves 13 in the Y direction has been anisotropically etched so as to be in parallel with the "OF" 10a with reference to the "OF" 10a of the silicon wafer 10. This means the "OF" 10a and the "OF" 20a, after the two wafers having been bonded to each other, should be in the parallel relationship (see FIG. 4). In this regard, in this drawing, the "OF" 16a of the high temperature polysilicon layer 16 (an apparent "OF" of the silicon wafer 10) is not in the parallel relationship with respect to the either "OF" 10a or 20a.

Since the present invention has employed such a manner for determining the position for placing the wafers one upon another by using the infrared ray, therefore in each consecutive step after the wafer bonding step, the auto-alignment of the bonded dielectric separation wafer with reference to the "OF" 20a can be carried out.

After that, in order to enhance the bonding strength of the thus obtained bonded wafer, thermal processing is applied to the wafer (again FIG. 3(i)). For example, a know thermal processing at a temperature of 1100° C. for the bonding may be carried out.

Figure 3J:
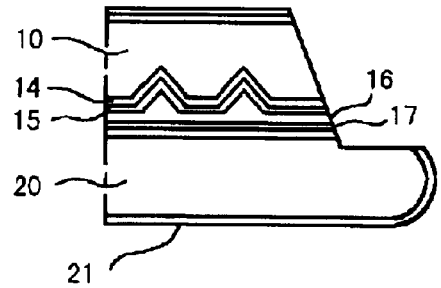

In the next step, the beveling is applied to the peripheral region of the active layer wafer portion of the bonded wafer to partially cut it off as shown in FIG. 3(j). A known beveling wheel may be used.

Figure 3K:
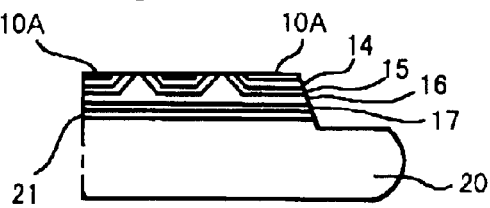

Then, the top surface on the side of the active layer wafer of this bonded wafer is ground and the ground surface is further polished (FIG. 3(k)). The volume to be ground off from the active layer wafer should be determined such that the dielectric separation oxide film 14 may be partially exposed to the outside and thus the dielectric separation silicon islands 10A separated from each other by the dielectric separation oxide film 14 may appear on top of the high temperature polysilicon layer 16. After that, the silicon oxide film 21 may be removed by the HF cleaning at any adequate times. Thus, the bonded dielectric separation wafer has been fabricated.

Further, after that, in a device manufacturing process, a desired device will be fabricated on the dielectric separation silicon islands 10A. In this case, for example, in the exposing process, the orientation flat "OF" 20a of the supporting substrate wafer described above may serve as the reference for the auto-alignment.

It is to be noted that although in the above description with respect to the transmission images, the dielectric isolation grooves in the Y-direction are used to establish the parallel relationship with the "OF" of the supporting substrate wafer, yet alternatively, the orientation flat of the active layer wafer and the "OF" of the supporting substrate wafer may be matched to each other.

What is claimed is:

1. A method for producing a bonded dielectric separation wafer comprising the steps of:
   growing a polysilicon layer on a top surface of an active layer wafer which has dielectric isolation grooves in a predetermined pattern having formed therein with reference to an orientation flat thereof and has been covered with a dielectric separation oxide film;
   polishing a top surface of the polysilicon layer;
   fabricating a bonded wafer by bonding the polished surface of said active layer wafer to a surface of a supporting substrate wafer having an orientation flat;
   beveling a peripheral portion of said bonded wafer; and
   after the beveling step, applying grinding and polishing to a back surface of said active layer wafer thereby making appear in the polished surface a plurality of dielectric separation silicon islands isolated by the dielectric separation oxide film,
   wherein in said bonding step, a transmission light passing through the wafers is used to detect a position of said pattern of the dielectric isolation grooves in said active layer wafer and a position of said orientation flat of said supporting substrate wafer, and based on the detected positions, said pattern of the dielectric isolation grooves of said active layer wafer and said orientation flat of said supporting substrate wafer are adjusted to fall in a certain physical relationship, and thereafter the bonding of the two wafers is carried out while holding them in said physical relationship.

2. A method for producing a bonded dielectric separation wafer in accordance with claim 1, in which an extending direction of said dielectric isolation grooves on said active layer wafer is set to be parallel with said orientation flat of said supporting substrate wafer.

3. A method for producing a bonded dielectric separation wafer in accordance with claim 1, in which said active layer wafer and said supporting substrate wafer are both silicon wafers and further an infrared ray is used as said transmission light.

4. A method for producing a bonded dielectric separation wafer comprising the steps of:
   growing a polysilicon layer on a top surface of an active layer wafer which has dielectric isolation grooves in a predetermined pattern having formed therein with reference to an orientation flat thereof and has been covered with a dielectric separation oxide film;
   polishing a top surface of said polysilicon layer;
   fabricating a bonded wafer by bonding the polished surface of said active layer wafer to a surface of a supporting substrate wafer having an orientation flat;
   beveling a peripheral portion of said bonded wafer; and
   after the beveling step, applying grinding and polishing to a back surface of said active layer wafer thereby making appear in the polished surface a plurality of dielectric separation silicon islands isolated by the dielectric separation oxide film,
   wherein in said bonding step, a transmission light passing through the wafers is used to detect a position of said orientation flat of said active layer wafer and a position of said orientation flat of said supporting substrate wafer, and based on the detected positions, said two orientation flats are matched with each other, and thereafter the bonding of said active layer wafer and said supporting substrate wafer is carried out while holding them in said matched condition.

5. A method for producing a bonded dielectric separation wafer in accordance with claim 4, in which said active layer wafer and said supporting substrate wafer are both silicon wafers and further an infrared ray is used as said transmission light.

6. An apparatus for bonding wafers, comprising:
   a first holding means for holding an active layer wafer;
   a second holding means for holding a supporting substrate wafer;
   a positioning means for determining proper positions for placing one upon another of said active layer wafer and said supporting substrate wafer held by said first and said second holding means, respectively; and
   a bonding means for bonding said active layer wafer to said supporting substrate wafer after said positions for placing the wafers one upon another having been determined,
   wherein said positioning means has a transmission detecting section for detecting respective portions in respective wafers working as markers in placing the wafers one upon another based on a transmission image of said supporting substrate wafer and another transmission image of said active layer wafer, each image captured as a result of irradiation of a transmission light capable of passing through those wafers, and executes the positioning of said active layer wafer and said supporting substrate wafer for placing one upon another by moving said first and said second holding means in the horizontal direction, respectively, based on the detected result from said transmission detecting section.

7. A method for producing a bonded dielectric separation wafer in accordance with claim 2, in which said active layer wafer and said supporting substrate wafer are both silicon wafers and further an infrared ray is used as said transmission light.

* * * * *